United States Patent [19]

Donahoe et al.

[11] Patent Number: 5,475,563
[45] Date of Patent: Dec. 12, 1995

[54] PCMCIA CARD HEAT REMOVAL APPARATUS AND METHODS

[76] Inventors: Daniel N. Donahoe, 8215 Knurled Oak, Spring, Tex. 77379; Henry E. Mecredy, III, 13416 Jones Rd., Houston, Tex. 77070

[73] Assignee: Compaq Computer Corporation; Houston Texas

[21] Appl. No.: 330,013

[22] Filed: Oct. 27, 1994

[51] Int. Cl.$^6$ .................................................. H05K 7/20
[52] U.S. Cl. ......................... 361/695; 361/687; 361/698; 361/699
[58] Field of Search .................................. 165/80.2, 80.3, 165/185, 80.4; 174/16.3; 361/687, 694–699

[56] References Cited

U.S. PATENT DOCUMENTS 4,825,337  4/1989  Karpman ................................ 174/16.3

*Primary Examiner*—Gregory D. Thompson
*Attorney, Agent, or Firm*—Konneker & Bush

[57] ABSTRACT

Operating heat generated by a PCMCIA card inserted into the base housing portion of a computer, representatively a notebook computer, is dissipated by a heat sink system disposed within the base housing. In response to insertion of the card into its associated support structure within the base housing, a metal heat sink plate member is resiliently pressed into firm engagement with a side of the inserted card by a spring member interconnected between the plate member and the card support structure. Card operating heat is efficiently transferred to the metal plate member by conduction. To dissipate the heat received by the plate member, a heat removing fluid is flowed against the plate member and caused to receive heat therefrom. Heat received by the fluid is then transferred to ambient air external to the computer to substantially lower the operating temperature of the inserted PCMCIA card. In one embodiment of the heat sink system the fluid is air flowed externally across the plate member, by a small fan disposed within the base housing, and then discharged outwardly through the base housing. In another embodiment of the heat sink system the fluid is a liquid sequentially pumped through a flow passage within the plate member, flowed through a radiator structure externally mounted on the computer, and then returned to the internal plate member flow passage.

14 Claims, 1 Drawing Sheet

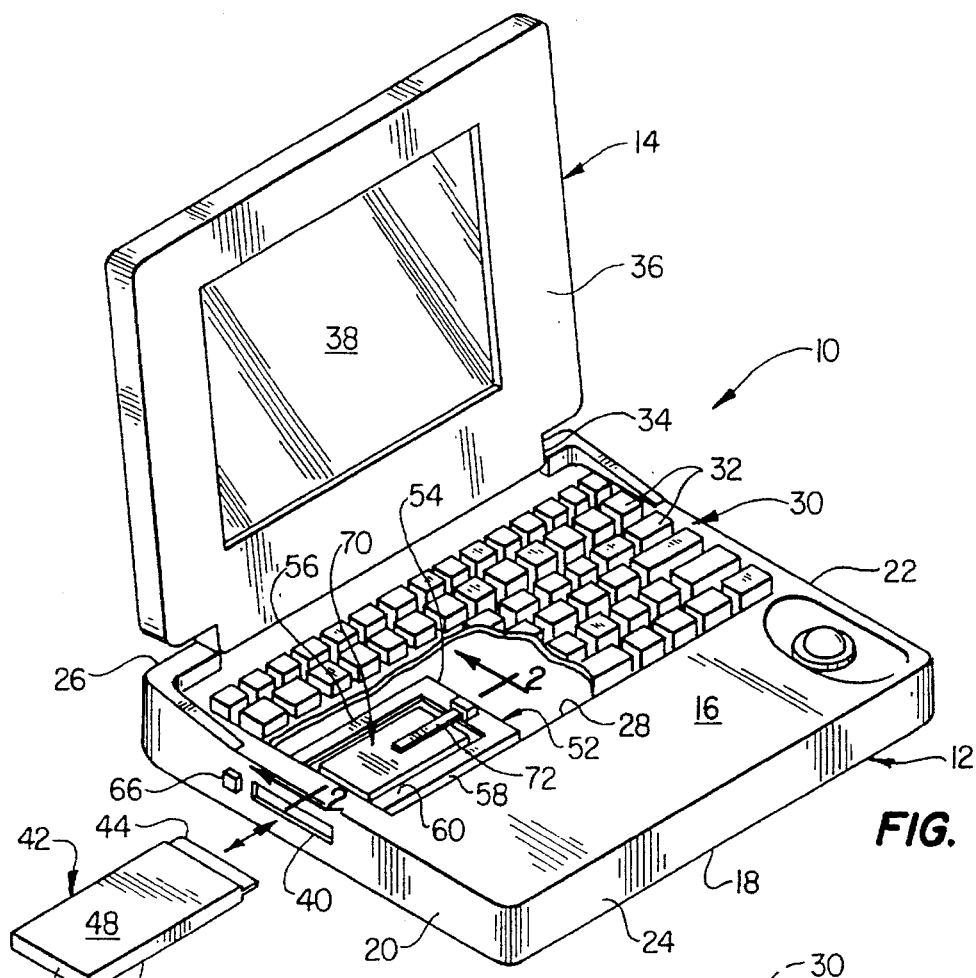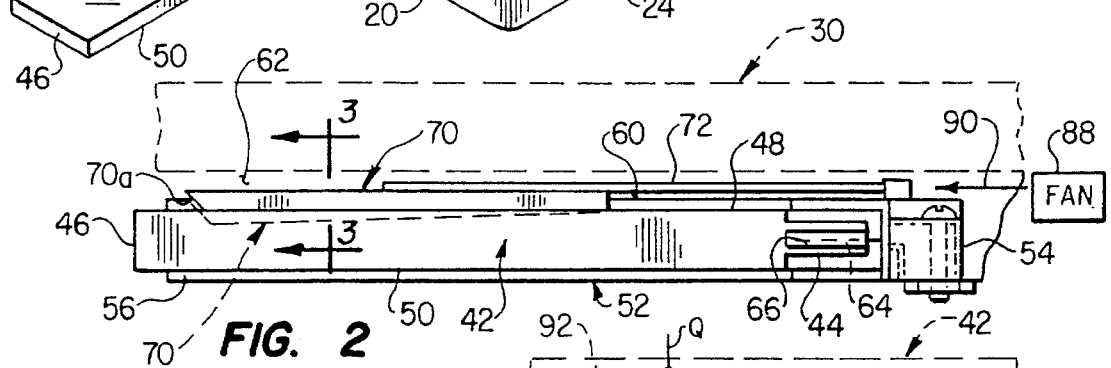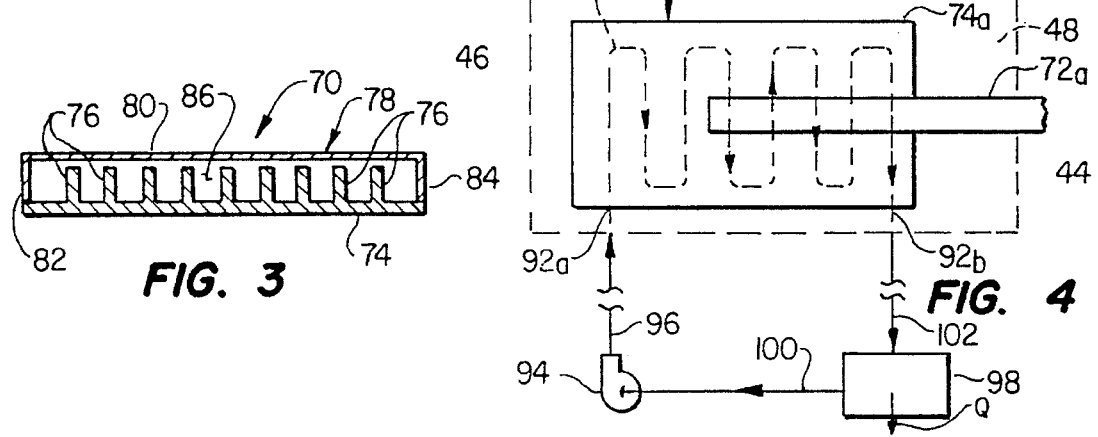

PCMCIA CARD HEAT REMOVAL APPARATUS AND METHODS

BACKGROUND OF THE INVENTION

1. Field of the Invention

The present invention generally relates to computer apparatus, and more particularly relates to the dissipation of heat generated by a PCMCIA card installed in a portable computer, such as a notebook computer, or other types of computers such as desktop computers.

2. Description of Related Art

Computer expansion cards produced under the auspices of the Personal Computer Memory Cards International Association are commonly referred to as "PCMCIA" cards and can greatly expand the performance of personal computers in ways that permit users to customize their computing ability, thereby increasing the flexibility and range of capabilities of personal computers. PCMCIA cards are especially targeted toward small, highly portable computers of the types commonly known as "laptops", "notebooks" and "sub-notebooks", and can provide expanded memory, fax, modem, network and various other expansion features for their associated computers.

A typical PCMCIA card is approximately 2" wide by 3" long and consists of a printed circuit board bearing a number of electronic and semiconductor components, and often additionally includes a specialized microprocessor and related chips. The card is also provided with a connector structure to interface with the host computer and, if appropriate, one or more connectors to interface with external communication means such as telephone lines. The card is typically encased in a two-part, light-gage stainless steel sheet metal housing.

Because the overall dimensions of a PCMCIA card are quite small, the generation of even a moderate amount of heat within the card can create excessive operating temperatures in the card. As a heat dissipating mechanism, convection is effectively negligible in the typical PCMCIA card operating environment where the card, upon operative insertion into the computer, is tightly surrounded by a card receiver, various connectors and assorted computer components, many of which are also heat-generating structures. Accordingly, PCMCIA card cooling must depend almost exclusively on conduction.

Current industry practice provides no special cooling features for PCMCIA cards. These cards may be used in larger computers such as desktops, in which case cooling is generally by forced convection and the cooling system in place for the computer may be adequate to cool any PCMCIA cards incorporated in the desktop computer. In smaller computers, however, the problem of cooling a PCMCIA card for reliability in a way that does not jeopardize the comfort of the user is not simple.

PCMCIA card cooling, in the past, has generally been approached by simply depending on conduction to spread the heat from the card into the remainder of the computer, and accepting the accompanying risk of uncomfortable product surface temperatures. The available conduction paths for dissipating operating heat from a PCMCIA card installed, for example, in a notebook computer include the PCMCIA card connector, the air within the card housing, and the air between the card housing and nearby, more conductive solid materials. Because air motion around the inserted card is effectively prevented by various physical structures closely surrounding it, the air immediately adjacent the inserted card acts substantially entirely as a conductive heat transfer medium and not a convective one.

None of these available heat conduction paths is suitably efficient from a heat transfer standpoint for dissipating operating heat from a PCMCIA card installed in a compact portable computer. It can thus be seen that a need exists for improved apparatus and methods for dissipating operating heat generated by a PCMCIA card installed in a portable computer, such as a notebook computer, or in other types of computers, such as desktop computers, where PCMCIA card cooling problems may arise. It is accordingly an object of the present invention to provide such improved apparatus and methods.

SUMMARY OF THE INVENTION

In carrying out principles of the present invention, in accordance with a preferred embodiment thereof, a computer is provided and includes a housing portion having support means therein for operatively supporting a PCMCIA card inserted into the interior of the housing portion. The computer is representatively a portable computer, but could alternatively be another type of computer such as a desktop computer.

To efficiently remove operating heat generated by the inserted PCMCIA card, specially designed heat removal means are provided. From a broad perspective, these heat removal means include (1) a thermally conductive heat sink structure disposed within the housing portion of the portable computer, (2) first means for resiliently and releasably holding the heat sink structure in forcible contact with a side of the inserted PCMCIA card to conductively receive operating heat therefrom, and (3) second means for flowing a fluid against the heat sink structure, transferring heat from the heat sink structure to the fluid, and then discharging heat from the fluid to ambient air external to the housing portion of the portable computer. By forcibly holding the heat sink structure against a side of the inserted PCMCIA card, the conduction of operating heat from the card to the heat sink structure is materially improved.

According to one feature of the invention, the heat sink structure includes a metal heat sink plate member, a side of which is resiliently held against a side of the inserted PCMCIA card by a spring member interconnecting the heat sink structure and a generally U-shaped support structure that operatively receives the PCMCIA card. The heat sink structure has a tapered leading edge portion that is engaged and deflected by a leading end portion of the inserted PCMCIA card to resiliently deflect the spring member to thereby resiliently hold the heat sink structure against a side of the inserted card.

In one embodiment of the heat removal means the heat sink structure includes a metal heat sink plate member having a first side positioned to be resiliently held against a side of the inserted PCMCIA card, a second side from which is spaced series of heat transfer fins outwardly project, and a shroud that extends over the fins and defines, on the second side of the heat sink plate member an open-ended passage within which the fins are disposed. A small fan disposed within the computer housing portion is operative to force air through this open-ended passage, to thereby transfer heat from the plate member to the air, and then discharge the air to ambient via a suitable external opening in the computer housing portion.

In another embodiment of the heat removal means the heat sink structure includes a metal heat sink plate member having an internal flow passage formed therein and having an inlet and an outlet. A small pump disposed in the computer housing portion forces a cooling liquid through the internal plate member passage, to thereby absorb heat from the plate member. Heated liquid exiting the passage is flowed through a radiator externally mounted on the computer, to transfer heat from the liquid to ambient air external to the computer, and is then routed back to the pump for flow thereby through the internal plate member passage.

BRIEF DESCRIPTION OF THE DRAWINGS

FIG. 1 is a simplified, partially exploded and cut away perspective view of a representative notebook computer incorporating therein specially designed PCMCIA card cooling apparatus embodying principles of the present invention;

FIG. 2 is an enlarged scale, partially schematic and phantomed cross-sectional view through a portion of the computer taken along line 2—2 of FIG. 1;

FIG. 3 is an enlarged scale cross-sectional view through a conductive heat sink portion of the cooling apparatus taken along line 3—3 of FIG. 2; and FIG. 4 is a schematic diagram of the card cooling apparatus illustrating an alternative method of dissipating heat from its conductive heat sink portion.

DETAILED DESCRIPTION

Perspectively illustrated in FIG. 1 is a computer 10, representatively a notebook computer, including a rectangular base housing portion 12, and a rectangular lid housing portion 14. Base housing 12 has top and bottom side walls 16 and 18, left and right end walls 20 and 22, and front and rear side walls 24 and 26. A rectangular opening 28 is formed in the base housing top side wall 16 and complementarily receives a rectangular keyboard assembly 30 having a spaced series of manually depressible key members 32 operatively mounted on its top side.

The lid housing 14 is hingedly secured, as at 34, to a top rear side edge portion of the base housing 12 and is pivotable relative to the base housing 12 between the open position indicated in FIG. 1, and a closed position (not shown) in which the lid housing 14 extends across and covers the top side of the base housing 12. Suitable latch means (not shown) are provided for releasably holding the lid housing 14 in its closed position. The lid housing 14 has an inner or front side 36 upon which a display screen 38 is supported.

A horizontally elongated slot 40 is formed in the left end wall 20 of the base housing 12, and a PCMCIA card 42 is insertable into, and withdrawable from, the interior of the base housing 12 through the slot 40. The PCMCIA card is of a conventional construction and configuration and has front and rear ends 44 and 46, and top and bottom sides 48 and 50.

Referring now to FIGS. 1 and 2, upon insertion, front end first, of the PCMCIA card 42 inwardly through the slot 40 the card 42 enters a conventionally constructed, generally U-shaped card support housing 52. The card support housing 52 has an inner end wall portion 54 spaced inwardly apart from and generally parallel to the base housing left end wall 20, and a spaced pair of opposite side wall portions 56 and 58 extending perpendicularly from opposite ends of the wall portion 54 to the base housing left end wall 20. The wall portions 54,56 and 58 border a top side opening 60 in the card support housing 54, and a relatively narrow air gap 62 is disposed between the top side of the card support housing 52 and the underside of the keyboard 30.

With the PCMCIA card 42 operatively inserted into the support housing 52, as illustrated in FIG. 2, connector pins 64 projecting inwardly from the inner end wall portion 54 are operatively received in corresponding sockets 66 in the front end 44 of the card 42. Conventional card ejector means (not shown) are carried by the card support housing 52 and are operated by a manually depressible ejector button 66 projecting outwardly from the left end wall 20 of the base housing 12 adjacent the card slot 40.

Still referring to FIGS. 1 and 2, to effectively dissipate operating heat generated by the inserted PCMCIA card 42 the present invention uniquely provides a specially designed heat sink system including a generally rectangular conductive heat sink structure 70 that is received within the top side opening 60 of the card support housing 52 and resiliently pressed against the top side 48 of the inserted PCMCIA card 42 by spring means representatively in the form of an elongated leaf spring member 72 secured at one end to the top side of the heat sink structure 70, and at its other end to the inner end wall portion 54 of the card support housing 52.

As best illustrated in FIG. 2, the left end of the heat sink structure 70 is downwardly and inwardly tapered, as at 70a. Additionally, with the PCMCIA card 42 removed from the card support housing 52, the heat sink structure 70 is supported in the indicated, downwardly offset dotted line position thereof by the unflexed leaf spring member 72. As the PCMCIA card 42 rightwardly enters the card support housing 52, the front end 44 of the card engages the sloping end 70a of the heat sink structure 70 and, by a camming action, forces the heat sink structure 70 upwardly, to its solid line horizontal position, as the card 42 further enters its support housing 52. When the inserted PCMCIA card 42 is operatively connected to the pins 64, the leaf spring member 72 resiliently holds the bottom side of the heat sink structure 70 against the top side 48 of the card 42 in firm heat conductive engagement therewith. As will be appreciated, other types of structures may be alternatively be utilized to forcibly hold the heat sink structure 70 in forcible contact with a side surface of the inserted card 42 if desired.

Referring now to FIG. 3, in the embodiment thereof illustrated in FIG. 2 the heat sink structure 70 has a bottom side portion defined by an aluminum heat conductor plate 74, the bottom side of which is pressed against the top side 48 of the inserted PCMCIA card 42 by the resilient force of the leaf spring member 72 or other suitable spring means. A spaced series of elongated heat transfer fin portions 76 project upwardly from the top side of the plate 74 and longitudinally extend parallel to its length (i.e., in a left-to-right direction as viewed in FIG. 2). An open-ended shroud member 78, having a top side wall 80 and opposite downturned side edge walls 82 and 84, is secured over the top side of the plate 74 and defines herewith a fluid flow passage 86 which extends between the opposite open ends of the shroud 78.

During operation of the inserted PCMCIA card 42, heat generated by the card is conductively transferred to the heat sink structure 70, with this conductive heat transfer being substantially facilitated by the forcible contact between the metal heat conductor plate 74 and the top side 48 of the card 42 resiliently maintained by the spring member 72. Card operating heat conductively transferred to the plate 74 is dissipated to the exterior of the computer 10 (via the slot 40) by the operation of a small, schematically depicted cooling fan 88 (see FIG. 2) disposed within the base housing 12 and operative to flow a stream of cooling air 90 sequentially through the shroud flow passage 86 and outwardly through the slot 40, or another suitable opening (not shown) in the base housing exterior wall portion. The card operating heat conductively transferred to the plate 74 is, in turn, transferred to the air stream 90 and discharged therewith to the exterior of the computer.

An alternate embodiment of the previously described heat sink system is schematically depicted in FIG. 4 and includes a metal heat conductor plate 74a resiliently pressed against the top side 48 of the inserted PCMCIA card 42 by a suitable spring member 72a interconnected between the plate 74a and the card support housing. A serpentined fluid flow passage 92 is appropriately formed through the interior of the plate 74a and has an inlet 92a and an outlet 92b.

A small, schematically depicted pump 94 is disposed within the base housing 12 and has an outlet connected to the inlet 92a by a conduit 96, and an inlet connected to the outlet of a small radiator structure 98 by a conduit 100. The radiator 98 is disposed externally on the computer (for example, on an exterior side portion of the lid housing 14) and has an inlet connected to the plate outlet 92b by a conduit 102.

During operation of the inserted PCMCIA card 42, the pump 94 is operated to force a suitable cooling liquid through the fluid flow passage 92, the pump 94 and the radiator 98 in the indicated direction. Heat Q conductively transferred to the heat conductor plate 74a is transferred to the liquid being forced through the internal plate member flow passage 92 and is carried by the liquid to the exterior radiator 98 from which the heat Q is discharged to ambient air outside the computer.

In both of the representatively illustrated embodiments of the heat sink system of the present invention, a heat receiving member is releasably held in forcible engagement with the inserted PCMCIA card to conductively receive heat generated thereby during operation of the card. Concurrently, a heat removing fluid is flowed against the heat receiving member and is caused to receive heat therefrom. The heat received by the fluid is then appropriately transferred to ambient air external to the computer to substantially lower the operating temperature of the inserted PCMCIA card.

While the computer 10 has representatively been illustrated as being a portable computer, it will be appreciated by those of skill in this particular art that the PCMCIA card cooling principles of the present invention could alternatively be utilized in conjunction with other types of computers such as desktop computers. Accordingly, as used herein, the term "computer" is intended to encompass not only portable computers but other types of computers, such as desktop computers, as well.

The foregoing detailed description is to be clearly understood as being given by way of illustration and example only, the spirit and scope of the present invention being limited solely by the appended claims.

What is claimed is:

1. A computer comprising:

a housing portion having support means therein for operatively supporting a PCMCIA card inserted into the interior of said housing portion; and heat removal means for removing operating heat generated by the inserted PCMCIA card, said heat removal means including:

a thermally conductive heat sink structure disposed within said housing portion, first means for resiliently and releasably holding said heat sink structure in forcible contact with a side of the inserted PCMCIA card to conductively receive operating heat from the inserted PCMCIA card, and second means for flowing a fluid against said heat sink structure, transferring heat from the heat sink structure to the fluid, and then discharging heat from the fluid to ambient air external to said housing portion, said thermally conductive heat Sink structure including a metal plate member, said support means including a generally U-shaped card support housing structure disposed within said housing portion of said computer and having an inner end wall portion, and said first means including spring means interconnected between said inner end wall portion and said heat sink structure and operative to resiliently and releasably hold a side of said metal plate member in forcible contact with said side of the inserted PCMCIA card.

2. The computer of claim 1 wherein said spring means include:

an elongated leaf spring member connected at one end thereof to said inner end wall portion, and at the other end thereof to said heat sink structure.

3. The computer of claim 2 wherein:

said heat sink structure has a tapered end portion and, with the PCMCIA card removed from said base housing, is held in a first position by said leaf spring member in a generally unflexed state thereof, said tapered end portion being positioned to be engaged and deflected by a leading end portion of the PCMCIA card, during insertion of the PCMCIA card into the interior of said base housing, to a second position that resiliently deflects said leaf spring member in a manner causing it to resiliently and operatively hold said plate member against the inserted PCMCIA card.

4. The computer of claim 1 wherein said second means include:

fan means, disposed within said housing portion, for flowing air against said heat sink structure and then discharging the air from said housing portion.

5. The computer of claim 4 wherein:

said heat sink structure includes a metal heat sink plate member having a first side positionable against said side of the inserted PCMCIA card by said first means, a second side from which a spaced plurality of cooling fin structures outwardly project, and a shroud member extending over said cooling fin structures and forming with said second side of said metal heat sink plate member an open-ended passage through which cooling air may be flowed, and said fan means are operative to flow air through said open-ended passage.

6. The computer of claim 1 wherein:

said heat sink structure includes a metal plate member having a first side positionable against said side of the inserted PCMCIA card by said first means, and a flow passage extending internally through said plate member and having an inlet and an outlet, and said second means are operative to flow a liquid through said flow passage.

7. The computer of claim 6 wherein said second means include:

a pump disposed within said base housing, a radiator externally carried on said computer, and conduit means communicating said inlet and outlet of said flow passage through said pump and radiator.

8. The computer of claim 1 wherein:

said computer is a portable computer.

9. The computer of claim 8 wherein:

said portable computer is a notebook computer.

10. For use in conjunction with a PCMCIA card operatively and removably inserted in a housing portion of a computer, a method of removing operating heat from the inserted PCMCIA card, said method comprising the steps of:

forcibly and removably positioning a thermally conductive heat sink structure against a side of the inserted PCMCIA card;

conductively transferring PCMCIA card operating heat to said heat sink structure;

flowing a fluid against said heat sink structure, transferring heat from said heat sink structure to the flowing fluid; and discharging heat from the flowing fluid to ambient air external to the computer, the inserted PCMCIA card being operatively received in a card support housing, and said step of forcibly and removably positioning being performed using a spring member supported to resiliently press said heat sink structure against said side of the inserted PCMCIA card, said step of forcibly add removably positioning further including the step of directly connecting said spring member between the card support housing and said heat sink structure.

11. The method of claim 10 wherein:

said step of flowing a fluid against said-heat sink structure is performed using a fan, disposed within the housing portion of the computer, to flow air against said heat sink structure, and said step of discharging heat from the flowing fluid to ambient air external to the computer is performed by discharging the air from the computer after the air has contacted said heat sink structure.

12. The method of claim 10 wherein:

said step of flowing a fluid against said heat sink structure is performed using a pump, disposed within the housing portion of the computer, to flow a liquid internally through said heat sink structure, and said step of discharging heat from the flowing fluid to ambient air external to the computer is performed by pumping liquid discharged from said heat sink structure through a radiator externally disposed on the computer.

13. The method of claim 10 wherein:

said step of forcibly and removably positioning is automatically performed in response to insertion of the PCMCIA card into the housing portion of the computer.

14. The method of claim 10 wherein:

said heat sink structure includes a metal plate member, and said step of forcibly and removably positioning is performed by forcibly and removably positioning a side of said metal plate member against said side of the inserted PCMCIA card.

* * * * *